United States Patent [19]
Wang et al.

[11] Patent Number: 6,014,338
[45] Date of Patent: Jan. 11, 2000

[54] SINGLE ENDED READ SCHEME WITH GLOBAL BITLINE OF MULTI-PORT REGISTER FILE

[75] Inventors: Yong Wang, Mountain View; Shree Kant, Sunnyvale, both of Calif.

[73] Assignee: Sun Microsystems, Inc., Palo Alto, Calif.

[21] Appl. No.: 09/219,268

[22] Filed: Dec. 23, 1998

[51] Int. Cl.[7] .................................................. G11C 7/00
[52] U.S. Cl. ..................................... 365/205; 365/230.05
[58] Field of Search ............................... 365/205, 230.03, 365/230.05

[56] References Cited

U.S. PATENT DOCUMENTS 5,570,319  10/1996  Santoro et al. ..................... 365/230.03

Primary Examiner—David Nelms
Assistant Examiner—M. Tran
Attorney, Agent, or Firm—Townsend and Townsend and Crew LLP

[57] ABSTRACT

A read system for a multi-ported register file includes a segmented bit line coupled to a global bit line. Each local bit line segment is coupled to a sub-set of the register files in a column to reduce device load and interconnect wire load. The local bit line segments are each coupled to the global bit line by a local sense amplifier. Both the local bit line segments and global bit line are precharged prior to sensing a bit so that the local sense amplifiers do not require output pull-up transistors.

4 Claims, 2 Drawing Sheets r: READ PORT OF RF CELL
RF: REGISTER FILE
LSA: SINGLE ENDED LOCAL SENSE AMPLIFIER
GSA: SINGLE ENDED GLOBAL SENSE AMPLIFIER
BL: READ BIT-LINE, GBL: GLOBAL READ BITLINE
SOUT: OUTPUT OF GLOBAL SENSE AMP
PRE: PRECHARGE

ROUTING LOAD OF INTERCONNECT
RC AND DEVICE LOAD r: READ PORT OF RF CELL
RF: REGISTER FILE
LSA: SINGLE ENDED LOCAL SENSE AMPLIFIER
GSA: SINGLE ENDED GLOBAL SENSE AMPLIFIER
BL: READ BIT-LINE, GBL: GLOBAL READ BITLINE
SOUT: OUTPUT OF GLOBAL SENSE AMP
PRE: PRECHARGE

⪫ ROUTING LOAD OF INTERCONNECT
⪫ RC AND DEVICE LOAD

SINGLE ENDED READ SCHEME WITH GLOBAL BITLINE OF MULTI-PORT REGISTER FILE

BACKGROUND OF THE INVENTION

Differential read schemes with local and global sense amplifiers are quite common in static RAMs. Implementing a differential read scheme in a register file having a large number of registers, where each register is multi-ported, presents, additional difficulties if differential sense amplifiers are used due to the efforts required to design these sensitive circuits.

Implementing a single ended read scheme is difficult due to the large number of register cells attached to each bit line which results in excessive device load due to the read access transistors' drain capacitance and the high interconnect resistance and capacitance due to the length of a bit line.

Accordingly, a simple and robust scheme for reading a multi-port register file is required.

SUMMARY OF THE INVENTION

According to one aspect of the present invention, the array of register file cells is partitioned into subsets of rows, with each subset connected to a respective local bit line segment. Each local bit line segment is connected to a global bit line by a local sense amp.

According to another aspect of the invention, the global bit line is connected to the input of a global sense amp which provides the output signal of the register file.

According to another aspect of the invention, each local sense amp includes a precharge circuit to precharge the local bit line segment prior to sensing a bit read from a register file cell. An inverter is connected to the local bit line segment and the output of the inverter is connected to the gate of a first pull-down transistor which has its drain connected to the global bit line and source connected to ground. The global sense amplifier also includes a precharge circuit which precharges the global bit line. Thus, a pull-up circuit is not required in the local sense amp.

According to another aspect of the invention, the local sense amplifier includes a second pull-down transistor between the ground terminal and source of the first pull-down transistor. The gate of the second pull-down transistor is connected to the precharge circuit and rapidly isolates the global bit line from ground thereby preventing bit line discharge when the precharge circuit in the global sense amp is activated. By rapidly shutting off the output circuit of the global bit line the generation of crowbar current, which could be generated if the global sense amp pulled up the global bit line while the local sense amp attempted to pull in down, is prevented.

According to another aspect of the invention, a feedback inverter connect the output of the local sense amp to the local bit line segment to restore the value of the bit line by providing leakage current.

Other features and advantages of the invention will be apparent in view of the following detailed description and appended drawings.

DESCRIPTION OF THE SPECIFIC EMBODIMENTS

A preferred embodiment will now be described with reference to FIG. 1, which is a block diagram of single-ended scheme for reading a multi-ported register file utilizing a segmented bit line architecture connected to a global bit line.

Figure 1:
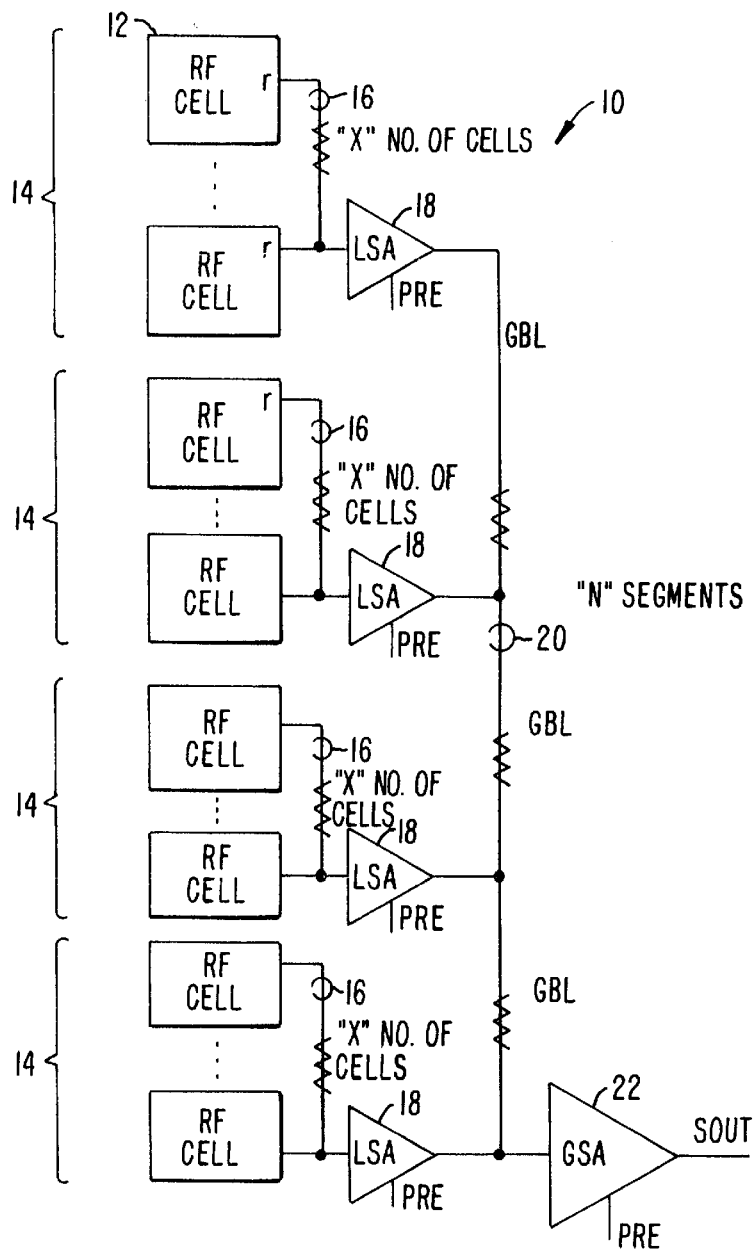
FIG. 1 is a block diagram of a segmented bit line connected to a global bit line by local sense amplifiers.

In FIG. 1, one bit line structure of a register file is depicted. Each register file cell (RF CELL) 12 may have several output ports of which only one is depicted in FIG. 1. In a preferred embodiment, a 32-bit register file includes RF CELLs 12 arranged in a 128×32 array. The array is broken up into 4 segments 14 of 32 rows each. Because each RF CELL 12 is multi-ported there is more than one set of 32 bit line structures 10 in the register file.

As depicted in FIG. 1, each segment 14 is connected to a local bit line segment 16 and each bit line segment 16 is connected by a local sense amp 18 to a global bit line (GBL) 20. The GBL 20 is input to global sense amp (GSA) 22 which provides the output signal (Sout).

The device load on each local bit line segment 16 is reduced because the number of RFCELLs 12 in each segment 14 is reduced and the bit line interconnect resistance and capacitance is low because the length of the bit line segment 16 is reduced. The device load on the GBL 20 is low because the only device load is from each of the local sense amps 18.

Sensing of the data is performed by selecting the RFCELL 12 with a word line (not shown) and amplifying the bit held in the RFCELL 12 utilizing the local sense amp 18. The local sense amp 18 drives its output onto the GBL 20 which is the input to the GSA 22.

Figure 2:
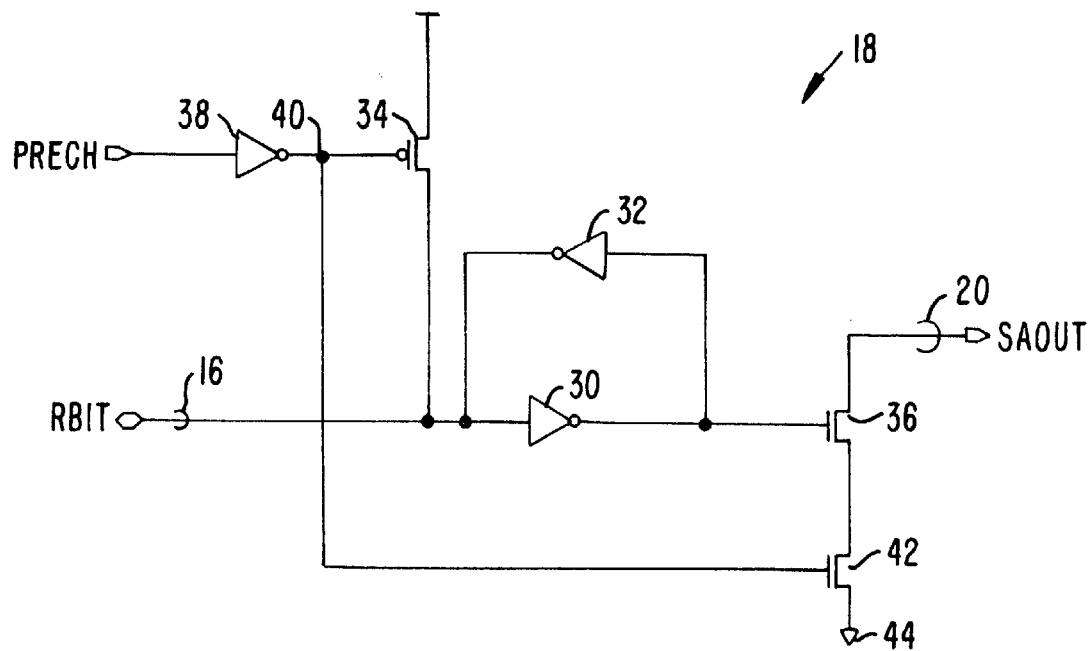
FIG. 2 is a circuit diagram of a local sense amplifier.

The design of the local sense amp 18 will now be described with reference to FIG. 2. In FIG. 2, the local sense amp 18 includes a skewed inverter 30 and a weak feedback inverter 32. The input to the skewed inverter 30 is connected to local bit line segment 16, which transmits the bit read from RFCELL 12 (rbit), and to the output terminal of a precharge PMOS pull-up transistor 34. The output of the skewed inverter 30 is connected to the input of the feedback inverter 32 and the gate of a first NMOS pull-down transistor 36.

A precharge inverter 38 has an input coupled to receive a precharge clock (prech) and an output connected to the precharge node 40. The precharge node 40 is connected to the gate of the precharge PMOS pull-up transistor 34 and the gate of a second NMOS pull-down transistor 42.

The first and second NMOS pull-down transistors 36 and 42 form a series circuit connecting the GBL 20 and a ground terminal 44 through them.

Figure 3:
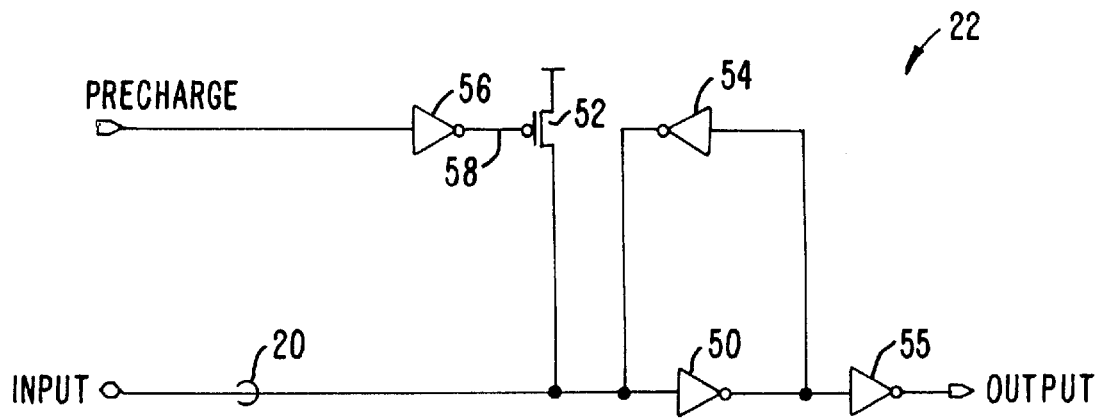
FIG. 3 is a circuit diagram of a global sense amplifier.

The design of the GSA 22 will now be described with reference to FIG. 3. A skewed inverter 50 has its input connected to the GBL 20, the output of a pull-up PMOS transistor 52 and the output of a feedback inverter 54. The skewed inverter 50 has its output connected to a driver 55 and the input of the feedback inverter 54.

A precharge inverter 56 has an input connected to receive a precharge clock (prech) and an output connected to a precharge node 58. The precharge node 58 is connected to the gate of the precharge PMOS pull-up transistor 52.

The operation of the local and global sense amplifiers 18 and 22 will now be described. Prior to sensing the bit, both the local bit line segment 16 and the global bit line 20 are precharged to $V_{DD}$ by the pull-up PMOS transistors 34 and 52 in the local and global sense amps 18 and 22 respectively.

The second pull-down NMOS transistor 42 in the local sense amp 18 prevents crowbar current which could be generated by the pulling up of the GBL 20 by the GSA 22 while the local sense amp 18 is simultaneously pulling down the GBL 20. The first pull-down transistor might turn off late due to delay through the skewing inverter 30 of the local sense amp 18. The second pull-down transistor 42 is turned off directly by the precharge node 40 without substantial delay.

Because both bit lines 16 and 20 are precharged, only a low signal needs to be sensed. The trip point of both skewed inverters 30 and 50 is skewed toward $V_{DD}$ to speed up sensing of a low rbit or GBS signal.

Both the local sense amp and GSA 18 and 22 include a weak feedback inverter 32 and 54 connecting the output of the skewing inverter to the bit line connected to the input. This feedback inverter provides current to offset the leakage current and maintain the bit line value.

The invention has now been described with reference to the preferred embodiment. Alternatives and substitutions will now be apparent to persons of skill in the art. In particular, the polarities of signals, type of transistors, or the transistor sizes given in FIGS. 2 and 3 are not critical to the practice of the invention. Further, the single-ended read scheme of the invention is useful in other SRAM applications that require robust sense amplifier circuits of simple design. Accordingly, it is not intended to limit the invention except as provided by the appended claims.

What is claimed is:

1. A system for reading data from a multi-ported register file of the type including an array of rows and columns of register file cells, which each port of a register file in one of the rows coupled to a bit line, said system comprising:

a plurality of bit line segments, each coupled to a subgroup of the rows of register file cells in the array;

a plurality of local sense amplifiers, each local sense amp having an input coupled to a respective local bit line, having a precharge circuit of precharging the local bit line prior to sensing a bit read from a register file cell in the array coupled to the bit line segment, and having an output port for providing a output signal determined by the value of a sensed bit;

a global bit line, coupled to the outputs ports of each local sense amp; and a global sense amp, having an input coupled to the global bit line and having a precharge circuit for precharging the global bit line prior to sensing a signal on the global bit line.

2. The system of claim 1 where said local sense amp further comprises:

an inverter, having an input connected to the local bit line segment, and an output;

a first pull-down transistor, having a gate connected to the output of the inverter, a drain connected to the global bit line, and a source;

a second pull-down transistor, having a gate connected to the precharge circuit, a drain connected to the source of the first pull-down transistor, and a source connected to ground so that signal delay of the inverter will not cause the first pull-down transistor to pull down the global bit line when it is being precharged.

3. The system of claim 1 where said local sense amp further comprises:

a feedback inverter, coupling the output of the skewed inverter to the local bit line segment to restore the value of the bit line by providing a leakage current to the bit line.

4. The system of claim 2 wherein said inverter has a trigger point skewed towards the supply voltage to more quickly sense an falling input signal.

* * * * *

UNITED STATES PATENT AND TRADEMARK OFFICE
CERTIFICATE OF CORRECTION

PATENT NO.   : 6,014,338
DATED        : January 11, 2000
INVENTOR(S)  : Wang et al.

It is certified that error appears in the above-identified patent and that said Letters Patent is hereby corrected as shown below:

Column 3,
Line 32, after "cells," delete "which" and insert therefor -- with --.

Column 4,
Line 4, after "providing", delete "a" and insert therefor -- an --.
Line 35, after "sense", delete "an" and insert therefor -- a --.

Signed and Sealed this

Tenth Day of December, 2002

JAMES E. ROGAN
*Director of the United States Patent and Trademark Office*